United States Patent [19]

Garner et al.

[11] 4,020,366
[45] Apr. 26, 1977

[54] PULSE TRAIN FREQUENCY CONTROL MEANS

[75] Inventors: Edward M. Garner, Kettering; Raymond S. Duley, Centerville, both of Ohio

[73] Assignee: NCR Corporation, Dayton, Ohio

[22] Filed: Apr. 22, 1976

[21] Appl. No.: 679,549

[52] U.S. Cl. ............................. 307/271; 307/210; 307/261; 307/237; 328/150

[51] Int. Cl.² ..................................... H03K 1/16

[58] Field of Search .......... 328/150; 307/210, 261, 307/271, 237

[56] References Cited

UNITED STATES PATENTS

| | | | |
|---|---|---|---|
| 3,223,929 | 12/1965 | Hofstad et al. | 307/210 |
| 3,320,434 | 5/1967 | Ott | 307/261 |
| 3,553,595 | 1/1971 | Walsh | 328/150 X |
| 3,852,617 | 12/1974 | Vidovic | 328/150 X |
| 3,986,055 | 10/1976 | Barzely | 307/271 |

*Primary Examiner*—John S. Heyman
*Attorney, Agent, or Firm*—J. T. Cavender; Albert L. Sessler, Jr.

[57] ABSTRACT

A circuit for supplying a pulse train to a utilizing device such as a stepping motor includes a timer for providing a pulse train which varies between two adjustable frequency limits, signal generating means, isolation and drive means, timer control means, and means controlled by the timer and capable of compensating for variations in components within the timer for controlling the inputs to the timer to maintain the desired frequency limits. The timer control means includes capacitive and resistive means and a gate capable of controlling the timer to provide a ratio of substantial magnitude between the upper and lower frequency limits. Additional means are provided for adjusting the frequency limits and the ratio therebetween.

14 Claims, 5 Drawing Figures

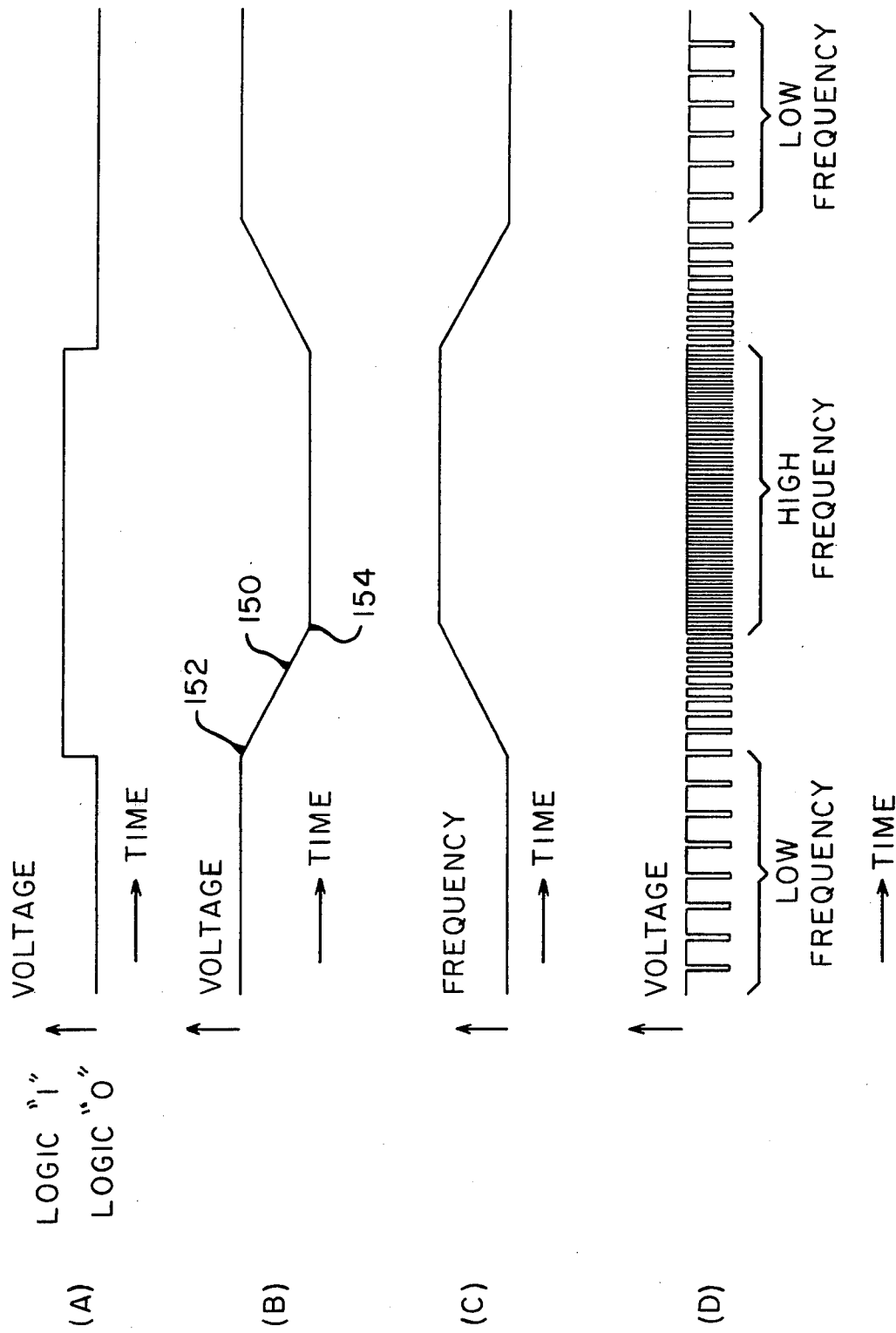

FIG. 5
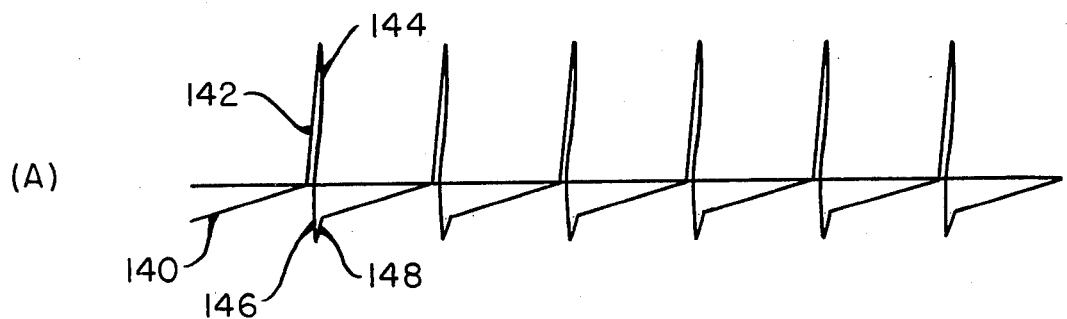
(A)
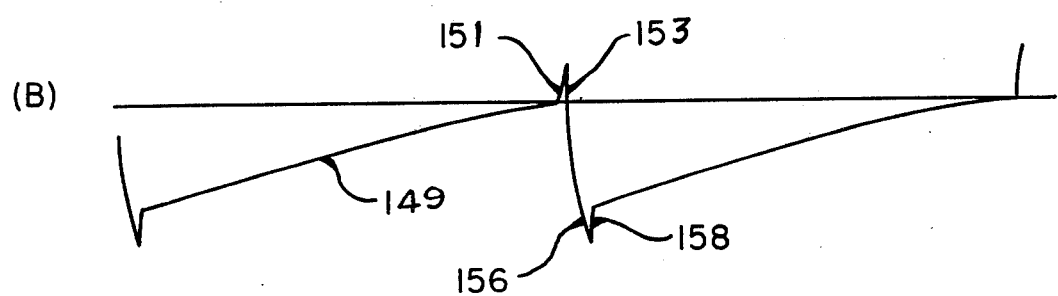
(B)
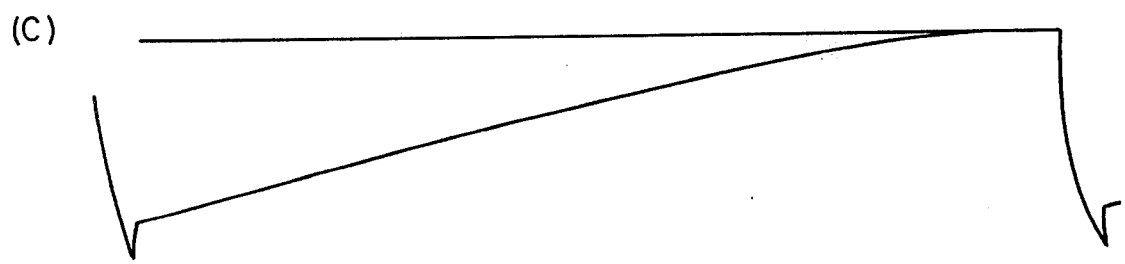
(C)

PULSE TRAIN FREQUENCY CONTROL MEANS

BACKGROUND OF THE INVENTION

The present invention relates generally to pulse generating means for generating a train of pulses which varies between two adjustable frequency limits, and more particularly to means for providing a ratio of substantial magnitude between upper and lower frequency limits and for maintaining said predetermined frequency limits when adjusted to the desired levels regardless of normal variations in components comprising a portion of the pulse generating means. Pulse trains of the type described above have many uses, one, for example, being in controlling stepping motors which normally function at one of two operating speeds and which are required to shift smoothly from one of said operating speeds to the other. Such stepping motors find utility in many applications, such as driving operation sequence instruction display films employed in various types of business machines.

A number of timing devices are now available on the general market which are capable of generating a variable frequency pulse train for use in such applications as driving stepping motors, for example. These devices are attractive in many respects, in that they are monolithic in construction, small in size and inexpensive in price. One problem with such timing devices is that the range between the upper and lower frequency limits is not great, which renders them unsuitable for some applications. Such range cannot normally readily be varied in these devices. Another problem is that the production of such timing devices in large quantities may result in variations in components within the devices, so that they will not operate in a uniform manner from device to device. Such uniformity of operation is essential when the timing devices are incorporated in products which are produced in substantial quantities. The necessary uniformity of operation can be achieved in such cases only by careful and precise testing of timing devices and/or by the incorporation in the product using the timing devices of complex adjusting circuits requiring individual testing and adjustment for each individual product in which the timer is used.

SUMMARY OF THE INVENTION

The purpose of the present invention is to provide a pulse train generating circuit including means capable of increasing substantially the ratio between the upper and lower frequency limits which may be derived from such devices, and also including means capable of compensating for variations in components within the circuit to maintain the desired pulse train parameters regardless of said variations, and means for providing relatively simple adjustability of the upper and lower frequency limits and the ratio therebetween.

According to the invention, a circuit for providing a pulse train comprises timing means to produce a pulse train of pulses at one of two predetermined upper and lower frequencies or varying therebetween in response to input signals applied thereto, control means for providing signals representative of said frequencies to said timing means, signal generating means coupled to said control means to provide an input signal to said control means representative of said upper and lower frequency levels and transitions therebetween in response to the application to said signal generating means of input signals thereto at one of two logic levels, and sensing means responsive to threshold levels sensed from said timing means and said control means and coupled to said signal generating means to control said input signal to said control means, whereby said input signals to the timing means cause said timing means to produce a pulse train varying between the predetermined frequency limits.

It is therefore an object of the present invention to provide an improved timer control circuit.

An additional object is to provide a timer control circuit capable of providing a ratio of substantial magnitude between the upper and lower frequency limits of the pulse train produced by the timer.

A further object is to provide a timer control circuit having means for adjusting the frequency limits and the ratio therebetween of the pulse train provided as the output of the timer.

A further object is to provide means for automatically compensating for variations in components within the timer for enabling the desired frequency limits to be maintained by the timer regardless of such variations.

A further object is to provide an effective inexpensive timing control circuit for use with a purchased timing device.

With these and other objects, which will become apparent from the following description, in view, the invention includes certain novel features of construction and combinations of parts, one form or embodiment of which is hereinafter described with reference to the drawings which accompany and form a part of this specification.

BRIEF DESCRIPTION OF THE DRAWING

FIG. 4 shows a plurality of waveforms illustrating voltage-time and frequency-time relationships at selected points in the circuitry of the present invention.

FIG. 5 shows a plurality of waveforms taken at a single point in the circuit, showing frequency and waveform configuration when the circuit is operating in high, low, and transitional frequency modes.

DETAILED DESCRIPTION OF THE PREFERRED EMBODIMENT

Figure 1:
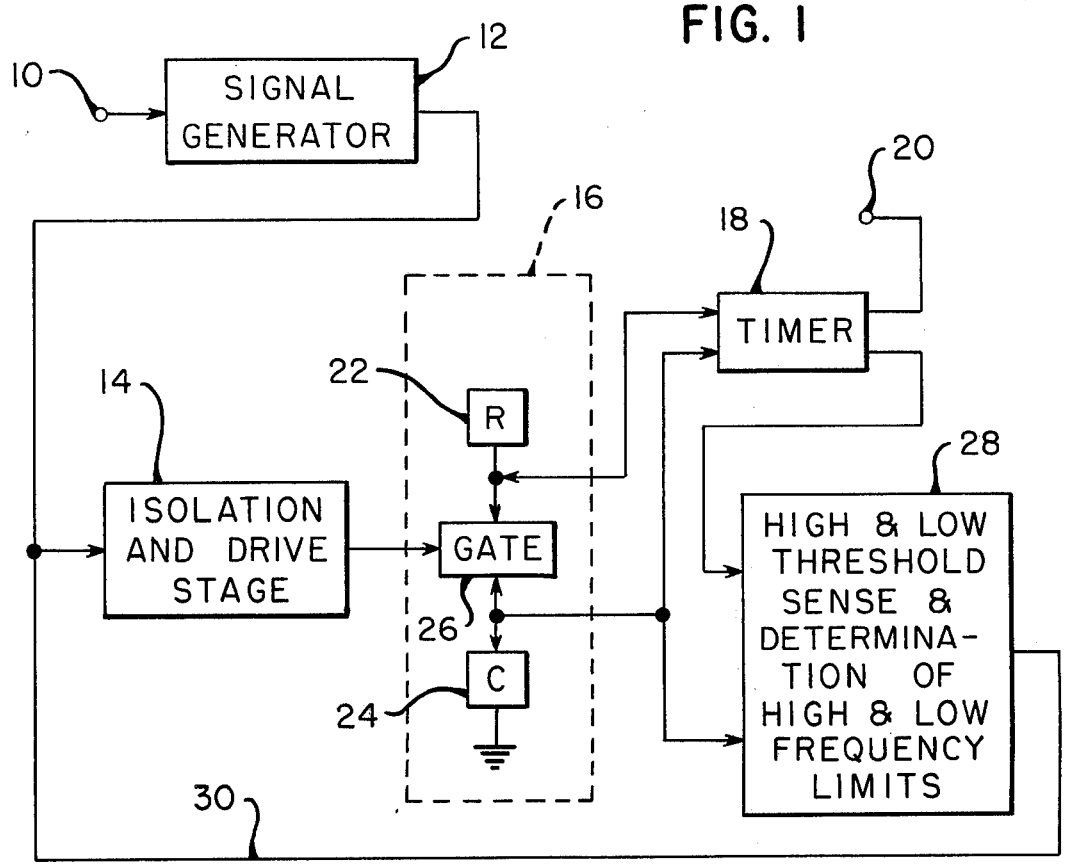
FIG. 1 is a block diagram of the timing circuit of the present invention.

Referring to FIG. 1, there is shown a block diagram of a timing circuit embodying the present invention. An input 10 is associated with a signal generator 12 which is connected through an isolation and drive stage 14 to a control circuit 16 for applying suitable signals to a timer circuit 18 for generation of a pulse train normally at one of two frequencies, or at transitional frequencies between the two limiting frequencies, said pulse train appearing at the output 20 for application to a suitable utilizing device such as, for example, a stepping motor. The control circuit 16 includes a resistive element 22, a capacitive element 24 and a gate 26. The timer circuit 18 may include, as its main component, a purchased timer, several such devices being available on the general market.

Outputs from both the control circuit 16 and the timer circuit 18 are applied to a threshold sensing and frequency limit determining circuit 28 to provide a signal which is applied over a conductor 30 to the junction of the ramp generator 12 and the isolation and drive stage 14. This signal provides clamp levels with automatic correction which results in a timer output on the terminal 20 which has the desired frequency range limits, regardless of variations in components of the timer which may arise in manufacturing, as well as variations of the power supply and in the ambient temperature in which the circuit of FIG. 1 functions.

Figure 2:
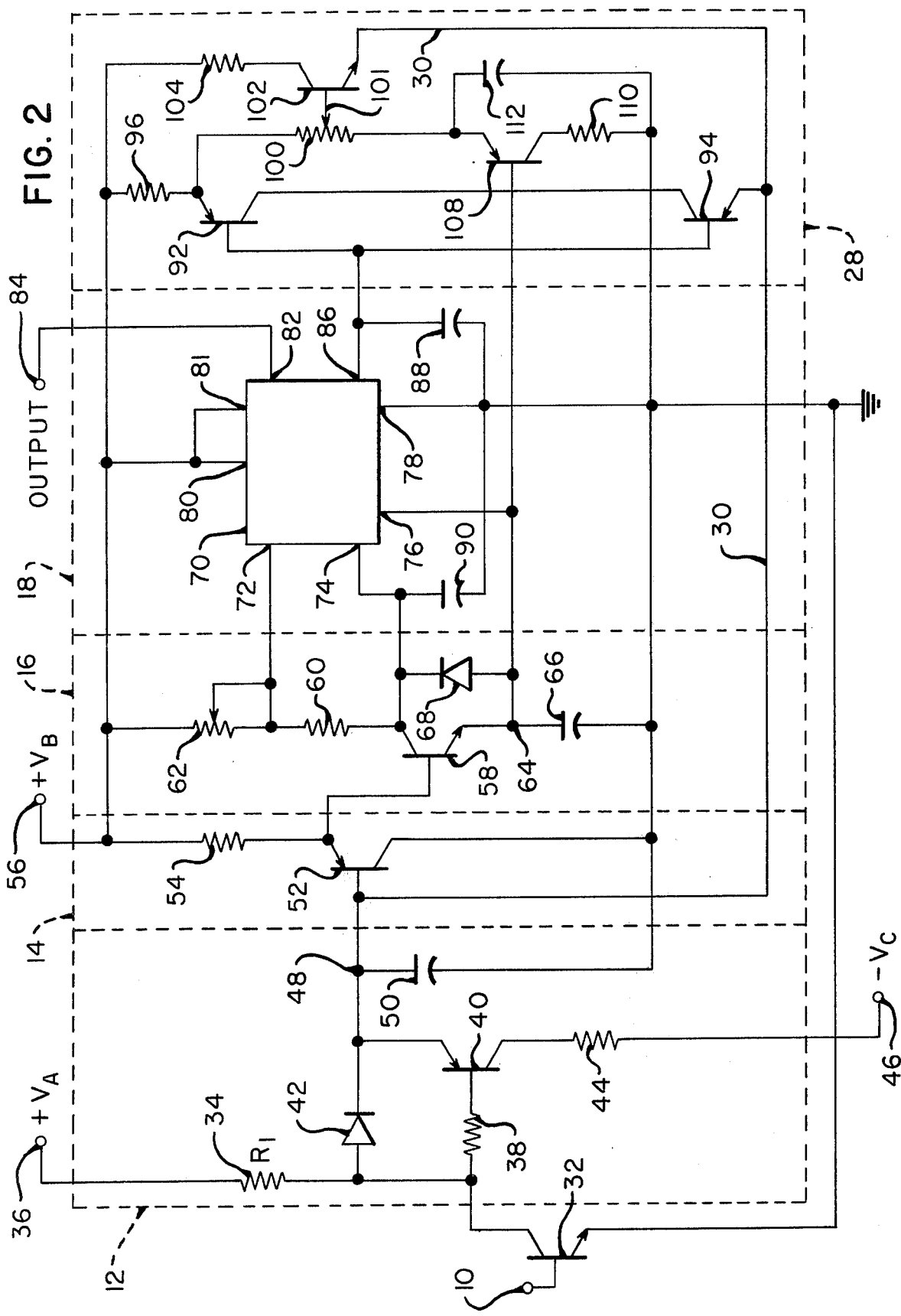
FIG. 2 is a schematic diagram showing the details of the circuitry of the present invention.

The various blocks of FIG. 1 are indicated by dashed lines in FIG. 2.

As shown more specifically in FIG. 2, the input terminal 10 is connected to the base of an NPN-type transistor 32, the emitter of which is connected to a base reference potential, shown as ground, and the collector of which is connected, in one circuit path, through a resistor 34 to a terminal 36, to which is applied a source of positive potential, said potential being +28 volts in the illustrated embodiment. A second circuit branch extends from the collector of the transistor 32 through a resistor 38 to the base of a PNP-type transistor 40, the collector of which is connected through a resistor 44 to a terminal 46, to which is applied a negative source of potential, being −12 volts in the illustrated embodiment of the invention. The emitter of the transistor 40 is connected through a diode 42 to the collector of the transistor 32.

A second circuit branch extends from the emitter of the transistor 40 through a node 48 to the base of a PNP-type transistor 52. From the node 48, a path extends through a capacitor 50 and thence to a base reference potential, or ground.

The emitter of the transistor 52 is connected through a resistor 54 to a terminal 56, to which is applied a positive source of potential, being +12 volts in the illustrated embodiment. The collector of the transistor 52 is connected to a base reference potential, or ground.

The emitter of the transistor 52 is also connected to the base of an NPN-type transistor 58, having its collector connected through a resistor 60 and a potentiometer 62 to the positive terminal 56. The potentiometer 62 may be used to adjust the lower output frequency limit of the timer 70. The emitter of the transistor 58 is coupled through a node 64 and a capacitor 66 to a base reference potential, or ground. The collector of the transistor 58 is also coupled to the node 64 through a diode 68.

The timer 70 which is employed in the circuit may be any one of several timers currently on the market. One such timer is the Texas Instruments No. SN72555; another suitable timer is the Signetics No. NE/SE555; and a third suitable timer is No. LM555 manufactured by National Semiconductor Company.

In FIG. 2, the timer is illustrated as having its "discharge" terminal 72 connected to the junction of the resistor 60 and the potentiometer 62. The "high threshold" terminal 74 of the timer is shown as being connected to the junction of the resistor 60 and the collector of the transistor 58. The "low threshold" terminal 76 of the timer is shown as being coupled to the node 64 of the circuit. The positive potential input terminal 80 of the timer is shown as connected to the positive terminal 56. The "ground" terminal 78 of the timer is connected to a base reference potential, or ground in the circuit. The "output" terminal 82 of the timer 70 is connected to a terminal designated as 84, which provides the output from the circuit. The "voltage reference" terminal 86 of the timer 70 is coupled to a capacitor 88, the other plate of which capacitor is connected to a base reference potential, or ground. The terminal 74 of the timer is also coupled through a capacitor 90 to a base reference potential, or ground. The "reset" terminal 81 is not used in the illustrated embodiment of the invention and is tied to the positive input terminal 80.

The "voltage reference" terminal 86 of the timer 70 is also coupled through additional circuit paths to the base of each of two PNP-type transistors 92 and 94. The collectors of these two transistors are coupled together, and to a base reference potential, or ground. The emitter of the transistor 92 is connected through a resistor 96 to the positive terminal 56, while the emitter of the transistor 94 is connected to the conductor 30 which extends to the base of the transistor 52 and to the node 48.

The collector of the transistor 92 is also coupled through a voltage-dividing network comprising a potentiometer 100 to the emitter of a PNP-type transistor 108, the base of which is connected to the node 64 and to the terminal 76 of the timer 70, and the collector of which is connected through a resistor 110 to the collector of the transistor 94. A capacitor 112 is connected from the emitter of the transistor 108 to the collector of the transistor 94.

The wiper 101 of the potentiometer 100 is connected to the base of an NPN-type transistor 102, the collector of which is connected through a resistor 104 to the positive terminal 56 and the emitter of which is connected to the conductor 30. As will subsequently be described, the setting of the wiper 101 of the potentiometer 100 can be altered to change the ratio between the upper and lower frequency limits of the timer. Alternatively, the potentiometer may be replaced by a pair of serially connected resistors having their junction connected to the base of the transistor 102. In such a modification, the individual resistors may be replaced by others of different values in order to change the ratio between the upper and lower frequency limits of the timer.

Figure 3:
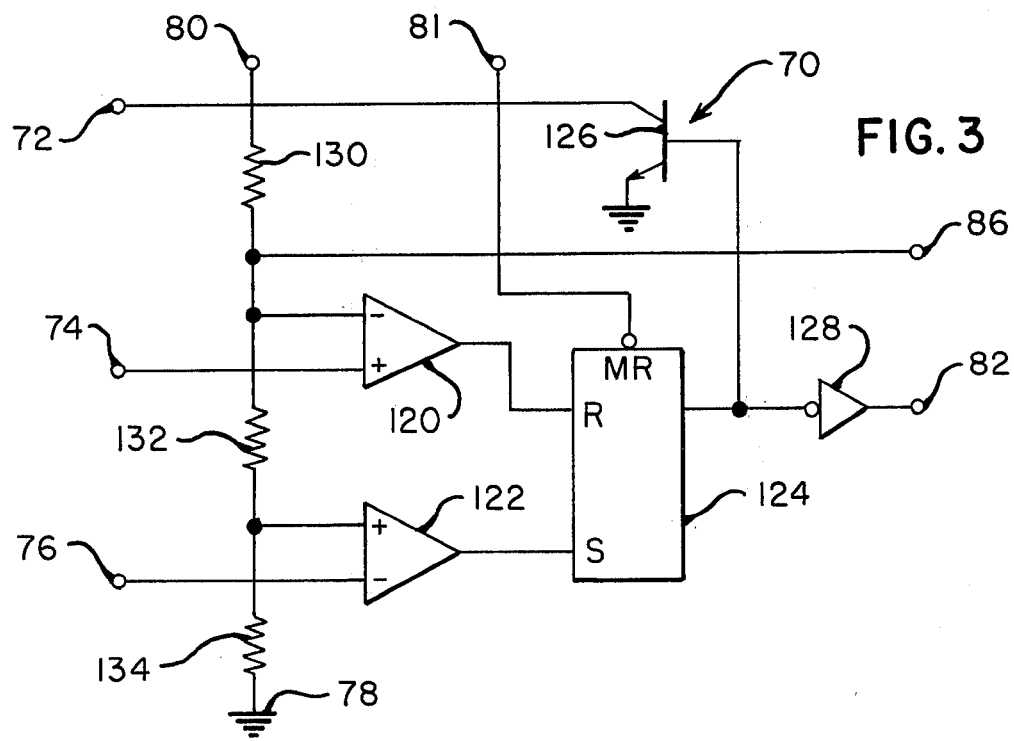
FIG. 3 is a simplified schematic drawing of a typical timer employed in connection with the present invention.

Shown in FIG. 3 is a simplified diagram of the timer 70. This timer includes a voltage divider circuit extending from the positive supply terminal 80 to the "ground" terminal 78 and including three serially connected resistors 130, 132 and 134. From the junction of the resistors 130 and 132, a path extends to one input of a comparator circuit 120, the other input of which is connected to the "high threshold" terminal 74. From the junction of resistors 132 and 134 a path extends to one terminal of a second comparator circuit 122, having a second input terminal connected to the "low threshold" terminal 76 of the timer 70. The outputs of the circuits 120 and 122 are connected to the "reset" and "set" inputs of a flip-flop 124, which has an output coupled over an inverter 128 to the "output" terminal 82 of the timer 70. The "reset" terminal 81 of the timer (not to be confused with "reset" input to the flip-flop 124) is connected to a "master reset" input to the flip-flop. As previously mentioned, the reset terminal 81 of the timer is not used in the present invention.

The voltage reference terminal 86 is coupled to the junction of the resistors 130 and 132.

The discharge terminal 72 of the timer 70 is connected to the collector of an NPN-type transistor 126, having its emitter coupled to a base reference potential or ground, and having its base coupled to the output of the flip-flop 124.

The operation of the circuit of the present invention will now be described. Let it be assumed that the input at the terminal 10 varies between low and high logic levels. Let it further be assumed for purposes of this portion of the description that the input at terminal 10 is at a low logic level of 0 volts, as shown in the left portion of FIG. 4A.

With the input at the terminal 10 at a 0-volt level, both of the transistors 32 and 40 are in a non-conducting state, and the capacitor 50 is charged to the upper clamp level, which is regulated by the transistor 94, as will subsequently be described. The potential at the node 48 is shown in the waveform of FIG. 4B in its relation to the input potential at the terminal 10, and is determined by a circuit path extendng from the positive terminal 36 through the resistor 34, the diode 42, the node 48, the conductor 30 through the resistor 34, the diode 42, the node 48, the conductor 30 and the transistor 94, to ground.

It may be noted at this point that due to the internal design of the timer 70, the frequency of the pulse train appearing at the circuit output terminal 84 is inversely proportional to the voltage appearing at the node 48. This is shown in FIG. 4C, in which frequency is plotted against time, and in FIG. 4D, in which pulses and intervals therebetween are illustrated, though not to scale, for each of the two frequency limits, and for the transitions therebetween.

With the capacitor 50 charged, the potential at the node 48 is approximately equal to the upper clamp level. The transistor 52 is an active transistor, functioning with the resistor 54 as an emitter follower. The potential on the emitter of the transistor 52 is never more than one base-emitter drop above the potential at the node 48.

The conductor from the emitter of the transistor 52 to the base of the transistor 58 provides control for the condition of said latter transistor, and establishes the maximum positive voltage to which the capacitor 66 can charge. Said capacitor is charged through the path extending from terminal 56 through the potentiometer 62, the resistor 60, the transistor 58, the node 64, and the capacitor 66, to ground; and will charge until the potential at the node 64 is equal to the potential at the node 48, at which time the conductive state of the transistor 58 changes to interrupt the charging path. The capacitor 66 remains at this level of charge for the time being. When the transistor 58 ceases conducting, the capacitor 90, which has been charging simultaneously with the capacitor 66, continues to charge to the high threshold level through a charge path extending from the positive terminal 56 through the potentiometer 62, the resistor 60, and the capacitor 90, to ground.

It may be noted at this time that the significance of the potential level at the node 48 is that it controls the maximum potential level at the node 64, due to the actions of the transistors 52 and 58. The transistor 52 is the "gate designated by reference character 26 in FIG. 1, and it gates the capacitor 66 (designated by reference character 24 in FIG. 1) in and out of the control circuit at a frequency which is controlled by the potential level of the node 48. That is, the higher the potential level is on node 48, the longer is the time that the capacitor 66 remains in the charging circuit; the longer is the time that the transistors 52 and 58 remain conducting; and the lower is the output pulse frequency from the timer 70. Conversely, the lower the potential level is on node 48, the higher is the output pulse frequency from the timer 70.

The resistor 60 and the potentiometer 62 are designated by the reference character 22 in the control circuit 16. It will be seen that changing the setting of the potentiometer 62 changes the charging time for the capacitor 62 and thereby alters the output frequency of the timer 70. Normally the lower frequency limit is altered by this adjustment, and the ratio between lower and upper frequency limits can then be altered, to alter the upper frequency limit, by adjustment of the potentiometer 100, as will subsequently be described.

The gating action of the transistor 58 referred to above is repeated once during each cycle of the timer 70 in producing a pulse at the output terminal 84. During each such cycle, the capacitor 66 is charged over the path described above. The potential at the collector of the transistor 58 is continually sampled for the upper voltage threshold at the input 74 of the timer 70, and the potential at the node 64 is continually sampled for the lower voltage threshold at the input 76 of the timer 70. When the voltage at the input 74 exceeds a given reference voltage, the potential at the "discharge" output 72 of the timer 70 goes essentially to ground, thus providing a discharge path through the diode 68 and the resistor 60 for the capacitors 66 and 90. This also causes the output at the terminal 84 to go to a low state.

The discharge path described above remains active until the potential applied to the lower threshold terminal 76 of the timer 70 from the node 64 drops below a predetermined reference level, which causes the timer 70 to open the discharge path so that the capacitors 66 and 90 cease discharging and begin to charge once more. At the same time, the output at the terminal 84 goes to a high level once more. The timing of the operation of the discharge path is thus in phase with the timing of output pulses generated by the timer 70 and appearing on the terminal 84. The waveform followed by the potential on the collector of the transistor 58 for each such cycle when the input signal at the terminal 10 is a low logic level is shown in FIG. 5C.

The manner in which the input signals to the high and low threshold terminals 74 and 76 of the timer 70 control the output at the "discharge" terminal 72, as well as the output signal at the "output" terminal 82, may readily be ascertained from an examination of technical literature which may easily be obtained for any one of several suitable and commercially available timers. However for purposes of convenience, the simplified schematic diagram of FIG. 3 is included herein, and a brief description of its mode of operation is provided.

The time 70 is a monolithic timing circuit capable of producing accurate time delays or oscillation. The upper threshold and lower threshold levels are normally two-thirds and one-third, respectively, of the positive input voltage applied to the terminal 80. When the low threshold input at terminal 76 falls below the low threshold reference voltage, as determined the comparator circuit 122, the flip-flop 124 is set and the output on terminal 82 goes high. When the upper threshold input at the terminal 74 rises above the upper threshold reference level, as determined by the comparator circuit, 120, the flip-flop 124 is reset, and the output at the terminal 82 goes low.

The reset input applied to terminal 81 can, in certain uses of the timer, override all other inputs, and can be used to initiate a new timing cycle. However in the present application of the timer, the reset is not used, and is tied to the positive input terminal 80.

When the output from the flip-flop 124 is low, a low impedance path is provided, by the turning on of the transistor 126, between the "discharge" terminal 72 and ground. This provides the discharge path for the capacitor 66, as has been previously noted in this description.

The voltage reference output on terminal 86 of the timer is equal to the upper threshold voltage of the timer, and establishes the upper clamp level previously referred to in this description. This is accomplished by regulating the conduction of the transistor 94. Examination of FIG. 2 shows that the terminal 86 is connected to the base of the transistor 94. The emitter of this transistor, which is connected to the conductor 30, will never be more positive than one base-to-emitter drop above the voltage reference of the timer 70. As noted previously, the series circuit including the positive terminal 36, the resistor 34, the diode 42, the conductor 30, and the transistor 94, extending through the collector thereof to ground, controls the upper clamp level at the node 48.

It will be seen from the above description that since the potential at the node 48 is in effect controlled by the voltage reference at terminal 86, which in turn is controlled by the voltage divider action of the resistors 130, 132 and 134 of the timer 70, as well as the potential applied to said timer, any variations or excessive tolerances in these resistors, as well as any excessive variations in the power supply, are compensated for by the application of the voltage reference potential, through the transistor 94, to the node 48. This insures that the potential at the node 48 will be of a proper level to coact with the reference potential within the timer, and the comparison will be made in the comparator 120 so that signals are applied from the comparator circuit 120 to the flip-flop 124 in the manner and frequency contemplated.

The transistor 92 acts as an emitter follower and regulates the potential on its emitter to one base-to-emitter drop above the voltage reference at the terminal 86. The transistor 108 also acts as an emitter follower and as a voltage hold circuit which establishes the voltage on its emitter at one base-to-emitter drop more positive than the lower voltage threshold at the node 64. The transistor 108 and the capacitor 112 function as a "sample and hold" circuit, taking its input from the node 64 and providing at the emitter of the transistor 108 a voltage representative of the lowest excursion of the potential at the node 64. Thus the potential at the emitter of the transistor 108 is a DC voltage which is regulated by the transistor 108 and the capacitor 112 to maintain a desired level representative of the lower threshold level of the timer. This potential, like the potential at terminal 86 previously referred to, therefore provides a reference means for controlling the potential on the node 48, at an appropriate minimum level to assure that the timer 70 will function properly. In the circuit associated with the transistor 108, the resistor 110 limits the collector current to prevent damage to said transistor.

The potentiometer 100 which is included in the circuit path between the emitters of the transistors 92 and 108 provides a voltage divider between the upper and lower voltage thresholds represented by the potentials at the emitters of the transistors 92 and 108. The potential at the slide 101 of the potentiometer 100 is applied to the base of the transistor 102. Adjustment of the slide 101 alters the potential applied to the base of the transistor 102 and thereby alters the ratio of the upper and lower frequency limits of the timer output pulse train. At this time, with the signal at the input terminal 10 of the circuit of FIG. 2 in a 0 state, the transistor 102 is not conducting because the potential on the conductor 30 applied to the emitter of transistor 102 is more positive than the potential at the wiper 101, connected to the base of the transistor 102. Therefore the transistor 102 does not take an active part in the operation of the circuit at this time. It should be noted that the resistor 104 functions to limit the collector current in the transistor 102 to a safe value within its specified limits at those times when the transistor 102 is conducting.

In summary, it may be stated that with a 0 logic level input at the terminal 10 of the circuit of FIG. 2, the timer 70 operates at the lower of its two operating frequency limits, with the output of the circuit appearing at terminal 84.

Let it now be assumed that a transition in logic level at the terminal 10 has taken place, and that the potential at termial 10 is at a "high" or "1" level, following the completion of said transition, as illustrated in the central portion of the input voltage waveform of FIG. 4A. The transient operating conditions found in the circuitry during the transitions from one state to another will be described subsequently.

With the potential at terminal 10 at the "high" logic level, the transistor 32 conducts, and the collector potential of said transistor applied to the base of the transistor 40 renders said transistor conducting. The potential at the node 48 is at its minimum level, as illustrated in the central portion of the waveform of FIG. 4B, which is determined by the lower voltage clamp transistor 102, the emitter of which is connected by the conductor 30 to the node 48. The manner in which the transistor 102 is controlled by other elements of the circuit will subsequently be described. The potential at the node 48 in this case is determined by a circuit path extending from the positive terminal 56, through the resistor 104, the transistor 102, the conductor 30, the node 48, the transistor 40 and the resistor 44 to the negative terminal 46. In addition, a base current path extends from the base of the transistor 40 through the resistor 38 and the transistor 32 to ground. Since the diode 42 is back biased at this time, it removes the path to the terminal 36 from this circuit.

With the input at the terminal 10 at a "high" logic level, the circuit components fo the isolation and drive stage 14, the control circuit 16 and the timer circuit 18 function in a manner which is generally similar to the manner in which said components functions with the input at the terminal 10 at a "low" logic level, except that with the node 48 at a substantially lower potential level, the capacitor 66 charges and discharges at a more rapid frequency, as shown in FIG. 5A, which represents the changing potential on the collector of the transistor 58.

The various portions of the waveform 5A may be correlated to events taking place within the circuit, as follows. The initial slope of the waveform, designated by the line 140, represents the time during which the capacitors 66 and 90 are charging. During the time 142, the capacitor 66 is no longer charging, but the capacitor 90 continues to charge to the upper threshold level. During the time 144, the capacitor 90 is discharging. During the time 146, both capacitors 66 and 90 are discharging; and during the time 148, the diode 68 is back biased and the transistor 58 conducts, which returns the potential on the collector 58 to the level at which it was at the beginning of the cycle just described.

The frequency of the output pulse train appearing at terminal 84 associated with the timer 70 is shown in the central porition of FIGS. 4C and 4D, and will be noted to be of higher frequency than the frequency of the pulse train generated when the input at the terminal 10 is at the high logic level.

The potential at the terminal 86 of the timer 70 and the minimum potential on the node 64 are the same when the "high" logic level signal is applied to terminal 10 as these potentials were with the "low" logic level signal applied to the terminal 10, as previously described. Therefore the tansistors 92 and 108 function in the same manner as previously described.

However, with the lower potential at the node 48 and the conductor 30, the transistor 94 is now non-conducting, while the transistor 102 conducts. Therefore with the "high" logic level signal on the terminal 10, the upper voltage clamp is not a factor in the circuit and the lower voltage clamp, controlled through the transistor 102, becomes operative. Thus the potential at the wiper 101, derived effectively from the upper and lower threshold levels of the timer 70 and the setting of the potentiometer 100, is applied to the base of the transistor 102 to control the conduction thereof, and by that means controls the potential at the node 48 to compensate for variations from the nominal values of the resistors 130, 132 and 134 in the timer 70, as well as variations in the power supply, and in the operating environment. This, in turn, assures that the input potentials applied to the upper and lower threshold terminals 74 and 76 of the timer 70 will be at the proper voltage level to cause said timer to operate as it is designed to do, to produce the desired pulse train at the proper frequencies.

It should be noted that the range between the upper and lower operating frequency limits of the timer 70 may be altered if desired by altering the setting of the potentiometer 100, or by replacing this potentiometer with a pair of resistors of the desired relative values of resistance, having their junction connected to the base of the transistor 102. In order to increase the ratio of frequencies between the upper and lower limits, the resistance of the portion of the potentiometer between the wiper 101 and the emitter of the transistor 108 should be decreased with respect to the portion of the potentiometer between the wiper 101 and the emitter of the transistor 92. The total resistance in the voltage dividing network should be maintained at approximately 10,000 ohms, so that if a pair of resistors is employed, and one of the resistors is decreased, the other resistor should be correspondingly increased. The use of the potentiometer 100 in place of two resistors accomplishes this in a convenient manner. The disadvantage of use of a potentiometer is the cost consideration, since the two resistors taken together are much less expensive than a potentiometer suitable for use in this application.

The operation of the circuit of FIG. 2 at both the upper and lower logic levels of signals applied to terminal 10 having been described, attention may now be directed to the transitional phases of operation, in which the logic level signal is in the process of shifting from one level to the other.

Let it be assumed that a transition is in progress from the "low" logic level to the "high" logic level at terminal 10. Such a transition, for proper operation of the circuit, should require a longer time to complete than the period of the high limiting frequency level of the timer 70. For purposes of illustration, circuit conditions will be described as they exist at a transitional point 150 of the waveform of FIG. 4B, which is intermediately positioned between the point 152 marking the termination of the upper potential level at the node 48 and the point 154 marking the commencement of the lower potential level thereon. The potential at the node 48 is thus somewhere between its maximum and minimum possible potentials. Since this potential at the node 48 is at an intermediate state, neither of the transistors 94 or 102 is conducting. As previously mentioned, these transisors and the components associated with them are included in the circuit for the purpose of establishing upper and lower voltage threshold limits for the node 48. Since the potential at the node 48 is somewhere between these limits during a transitional state, no need exists for these transistors to be in an active state at such a time.

In a "low" to "high" transition of the logic level at the terminal 10, the transistors 32 and 40 commence to conduct almost simultaneously with the change of signal at the terminal 10. The capacitor 50 then commences to discharge through a path extending through the node 48, the transistor 40, and the resistor 44 to the negative terminal 46. The time from the point 152 to the point 154 in FIG. 4B represents the time required for the capacitor 50 to complete discharging from the upper clamp level to the lower clamp level determined by the transistor 102, as previously mentioned.

The decreasing potential on the node 48 applied to the base of the transistor 52 and thence to the base of the transistor 58 causes the frequency of the output pulse train appearing at the terminal 84 of the timer 70 to correspondingly increase as shown in FIGS. 4C and 4D. This is because of the control which the potential at the node 48 exercises through the transistor 58 on the amount of time during each cycle that the capacitor 66 is included in the timing circuit for the timer 70, said timing circuit including the resistor 60, the potentiometer 62, and the capacitors 66 and 90.

The changing state of the potential on the collector of the transistor 58 during a transitional phase of operation is represented by the waveform shown in FIG. 5B. The various portions of the waveform may be correlated to events taking place within the circuit, as follows. The initial slope of the waveform, designated by the line 149, represents the time during which the capacitors 66 and 90 are charging. During the time 151, the capacitor 66 is no longer charging, but the capacitor 90 continues to charge to the upper threshold level. During the time 153, the capacitor 90 is discharging. During the time 156, both capacitors 66 and 90 are discharging; and during the time 158, the diode 68 is back biased and the transistor 58 conducts, which returns the potential on the collector of the transistor 58 to the level at which it was at the beginning of the cycle just described. It will be noted by a comparison of FIGS. 5A, 5B and 5C that the waveform shown in FIG. 5B is of intermediate frequency between the relatively high frequency of the waveform shown in FIG. 5A and the relatively low frequency of the waveform shown in FIG. 5C.

The functioning of the circuit during a transition from a "low" logic level to a "high" logic level at terminal 10 having been described above, it is believed that the manner in which the circuit functions during a transition from "high" logic level to "low" logic level at terminal 10 will be obvious from this description to one having ordinary skill in the art.

While the form of the invention illustrated and described herein is particularly adapted to fulfill the objects aforesaid, it is to be understood that other and further modifications within the scope of the following claims may be made without departing from the spirit of the invention.

What is claimed is:

1. A circuit for providing a pulse train, comprising:
   timing means to produce a pulse train of pulses at one of two predetermined upper and lower frequencies or varying therebetween in response to input signals applied thereto;
   control means for providing signals representative of said frequencies to said timing means;
   signal generating means coupled to said control means to provide an input signal to said control means representative of said upper and lower frequency levels and transitions therebetween in response to the application to said signal generating means of input signals thereto at one of two levels; and
   sensing means responsive to threshold levels sensed from said timing means and said control means and coupled to said signal generating means to control said input signal to said control means,
   whereby said input signals to the timing means cause said timing means to produce a pulse train varying between the predetermined frequency limits.

2. The circuit of claim 1 in which isolation and drive means are coupled between said signal generating means and said control means.

3. The circuit of claim 1 in which the signal generating means includes capacitive means, the charging and discharging levels of which are determined by said coupling to the sensing means.

4. The circuit of claim 1 in which the sensing means includes alterable voltage dividing means for varying the magnitude of the range between upper and lower frequencies of the timing means.

5. The circuit of claim 1 in which the sensing means includes two transistors, the bases of which are coupled to the timing means and the control means.

6. The circuit of claim 5 in which voltage dividing means are coupled between the emitters of said transistors, and the base of a third transistor is coupled to said voltage dividing means, said third transistor being coupled to said signal generating means to control said input signal to said control means.

7. The circuit of claim 1 in which the sensing means includes a fourth transistor having its base coupled to the timing means, said fourth transistor being coupled to said signal generating means to control said input signal to said control means.

8. The circuit of claim 1 in which the control means includes capacitive means, the charging duration of which determines the frequency of operation of the timing means.

9. The circuit of claim 8 in which the control means also includes gating means for controlling the charging path for said capacitive means.

10. The circuit of claim 9 in which the gating means is a transistor.

11. The circuit of claim 10 in which the input signal from the signal generating means is applied to the base of the transistor.

12. The circuit of claim 1 in which the input signal from the signal generating means to the control means determines the charging duration of the capacitive means of the control means.

13. The circuit of claim 1 in which the control means includes an adjustable impedance by adjustment of which the lower frequency level of the timing means may be varied.

14. The circuit of claim 8 in which the timing means includes a discharge means for providing a discharge path for discharge of the capacitive means of the control means.

* * * * *